(12) United States Patent
Lu et al.

(10) Patent No.: US 9,111,768 B2
(45) Date of Patent: Aug. 18, 2015

(54) SEMICONDUCTOR DEVICES, METHODS OF MANUFACTURE THEREOF, AND METHODS OF FORMING RESISTORS

(71) Applicant: Taiwan Semiconductor Manufacturing Company, Ltd., Hsin-Chu (TW)

(72) Inventors: Chia-Yu Lu, Hsin-Chu (TW); Shyue-Shyh Lin, Zhubei (TW); Chin-Shan Hou, Hsin-Chu (TW); Kuo-Feng Yu, Zhudong Township (TW); Tung-Heng Hsieh, Zhudong Town (TW); Chih-Hung Wang, Hsin-Chu (TW); Jian-Hao Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/486,923

(22) Filed: Sep. 15, 2014

(65) Prior Publication Data
US 2015/0001678 A1 Jan. 1, 2015

Related U.S. Application Data

(62) Division of application No. 13/492,571, filed on Jun. 8, 2012, now Pat. No. 8,859,386.

(51) Int. Cl.
| | |
|---|---|
| *H01L 27/088* | (2006.01) |
| *H01L 27/13* | (2006.01) |
| *H01L 27/06* | (2006.01) |
| *H01L 49/02* | (2006.01) |
| *H01L 23/485* | (2006.01) |

(Continued)

(52) U.S. Cl.
CPC ...... *H01L 27/0629* (2013.01); *H01L 21/76811* (2013.01); *H01L 23/485* (2013.01); *H01L 23/5228* (2013.01); *H01L 27/0688* (2013.01); *H01L 28/20* (2013.01); *H01L 28/24* (2013.01); *H01L 2924/0002* (2013.01)

(58) Field of Classification Search
CPC .... H01L 21/707; H01L 27/0629; H01L 28/20
USPC .......... 257/350, 358, 360, 379, 577, E27.016, 257/E27.035, E21.004; 438/384, 385
See application file for complete search history.

(56) References Cited

U.S. PATENT DOCUMENTS

| 4,823,179 A | 4/1989 | Koshimaru |
|---|---|---|
| 5,128,745 A | 7/1992 | Takasu |

(Continued)

FOREIGN PATENT DOCUMENTS

TW  I291760  12/2007

*Primary Examiner* — Allan R Wilson
(74) *Attorney, Agent, or Firm* — Slater & Matsil, L.L.P.

(57) ABSTRACT

Semiconductor devices, methods of manufacture thereof, and methods of forming resistors are disclosed. In one embodiment, a method of manufacturing a semiconductor device includes forming a first insulating material over a workpiece, and forming a conductive chemical compound material over the first insulating material. The conductive chemical compound material is patterned to form a resistor. A second insulating material is formed over the resistor, and the second insulating material is patterned. The patterned second insulating material is filled with a conductive material to form a first contact coupled to a first end of the resistor and to form a second contact coupled to a second end of the resistor.

20 Claims, 15 Drawing Sheets

(51) Int. Cl.
*H01L 23/522* (2006.01)
*H01L 21/768* (2006.01)

(56) References Cited

U.S. PATENT DOCUMENTS

| | | | |
|---|---|---|---|
| 5,381,046 | A | 1/1995 | Cederbaum |
| 6,717,233 | B1 | 4/2004 | Haddad |
| 7,022,246 | B2 | 4/2006 | Chinthakindi |
| 7,749,822 | B2 | 7/2010 | Freeman |
| 8,680,618 | B2 * | 3/2014 | Eshun ............................ 257/350 |
| 2005/0269663 | A1 | 12/2005 | Minami |
| 2006/0181388 | A1 | 8/2006 | Chinthahindi |
| 2007/0096183 | A1 | 5/2007 | Ogawa |
| 2009/0090977 | A1 * | 4/2009 | Freeman et al. ............... 257/379 |
| 2011/0186916 | A1 | 8/2011 | Kurz |
| 2013/0009225 | A1 * | 1/2013 | Kocon ........................... 257/296 |
| 2013/0105912 | A1 | 5/2013 | Hsu |
| 2013/0328131 | A1 | 12/2013 | Lu et al. |
| 2014/0357047 | A1 * | 12/2014 | Kawahara et al. ............ 438/384 |

* cited by examiner

SEMICONDUCTOR DEVICES, METHODS OF MANUFACTURE THEREOF, AND METHODS OF FORMING RESISTORS

PRIORITY CLAIM AND CROSS-REFERENCE

This application is a divisional of, and claims the benefit of, U.S. patent application Ser. No. 13/492,571, filed on Jun. 8, 2012, titled "Semiconductor Devices, Methods of Manufacture Thereof, and Methods of Forming Resistors," which is incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

One type of circuit component used frequently in semiconductor devices is a resistor. In some applications, resistors comprising polysilicon are formed in front-end-of-line (FEOL) processes in which other devices such as transistors are formed. However, in advanced metal gate processes, additional lithography masks are required to recess shallow trench isolation regions in order to protect polysilicon from being removed, and also for implantation processes of the polysilicon material of the resistors in order to lower the resistance, which causes increased manufacturing costs.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Embodiments of the present disclosure are related to the formation of resistors of semiconductor devices. Novel semiconductor devices, methods of manufacture thereof, and resistor formation methods will be described herein.

Figure 1:
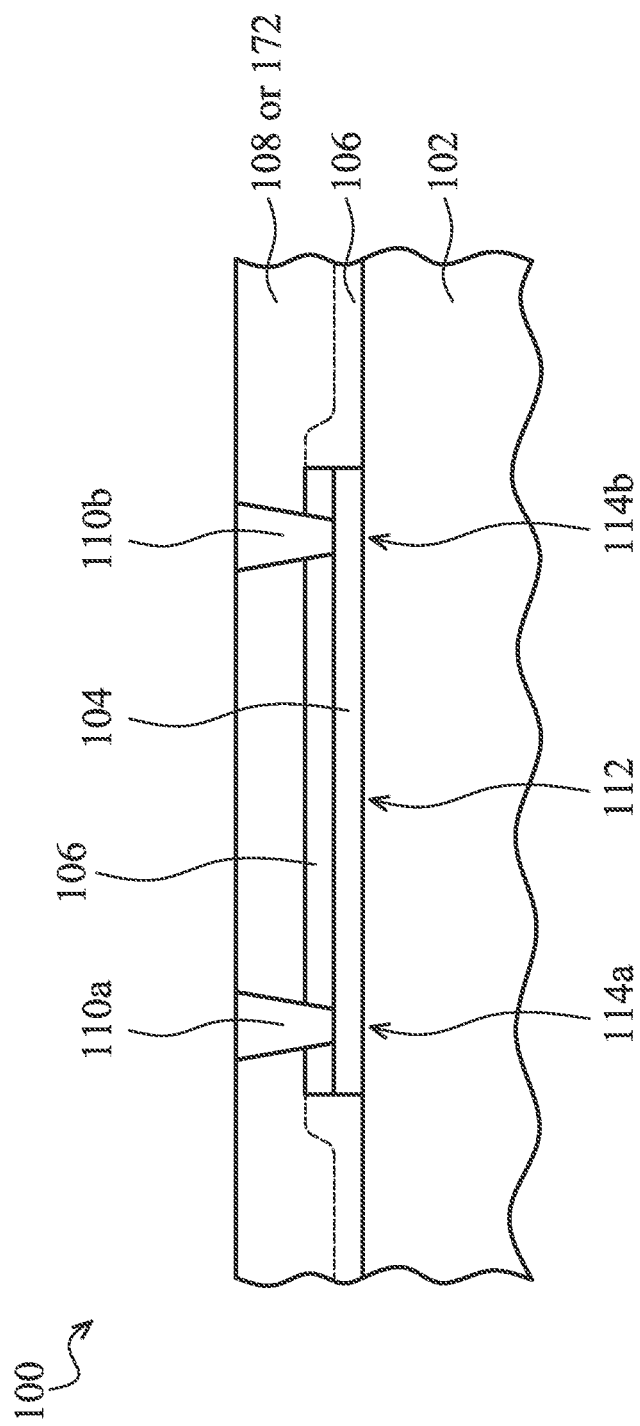
FIG. 1 is a cross-sectional view of a resistor in accordance with an embodiment of the present disclosure.

Referring first to FIG. 1, there is shown a cross-sectional view of a semiconductor device 100 including a resistor 112 comprising a conductive chemical compound material 104 in accordance with an embodiment of the present disclosure. The semiconductor device 100 includes a workpiece 102. The workpiece 102 may include a semiconductor substrate comprising silicon or other semiconductor materials and may be covered by an insulating layer, for example. The workpiece 102 may also include other active components or circuits such as transistors, not shown; see transistor 150 shown in FIGS. 2 through 14. The workpiece 102 may comprise silicon oxide over single-crystal silicon, for example. The workpiece 102 may include other conductive layers or other semiconductor elements, e.g., transistors, diodes, etc. Compound semiconductors, GaAs, InP, Si/Ge, or SiC, as examples, may be used in place of silicon. The workpiece 102 may comprise a silicon-on-insulator (SOI) or a germanium-on-insulator (GOI) substrate, as examples.

The resistor 112 is disposed over the workpiece 102. An insulating material 106 may be disposed over the resistor 112 in some embodiments. The insulating material 106 may also be disposed over other portions of the workpiece 102, as shown by dashed lines in FIG. 1. An insulating material 108 (see also FIG. 8) or 172 (see also FIG. 14) is disposed over the resistor 112 and over the insulating material 106. A first contact 110a is coupled to a first end 114a of the resistor 112, and a second contact 110b is coupled to a second end 114b of the resistor 112 that is opposite the first end 114a. The second end 114b of the resistor 112 is different from the first end 114a, for example.

Only one resistor 112 is shown in FIG. 1; however, a plurality of resistors 112 may be formed across a surface of the workpiece 102, depending on the application of the semiconductor device 100. The resistor 112 is formed proximate a transistor 150 in some embodiments (see FIG. 8), to be described further herein. The resistor 112 advantageously comprises a resistance comparable to a resistance of a polysilicon resistor, and may be used to replace polysilicon resistors used in transistor applications, in some embodiments. The resistor 112 comprises a sheet resistance of about 200 to 1,000 ohms per square ($\Omega$/sq), for example. Alternatively, the resistor 112 may comprise other sheet resistance values, depending on factors such as the type of material and the film thickness of the conductive chemical compound material 104, as examples. The resistor 112 is advantageously formed in a MEOL or BEOL process, rather than a FEOL process, also to be described further herein.

Figure 2:
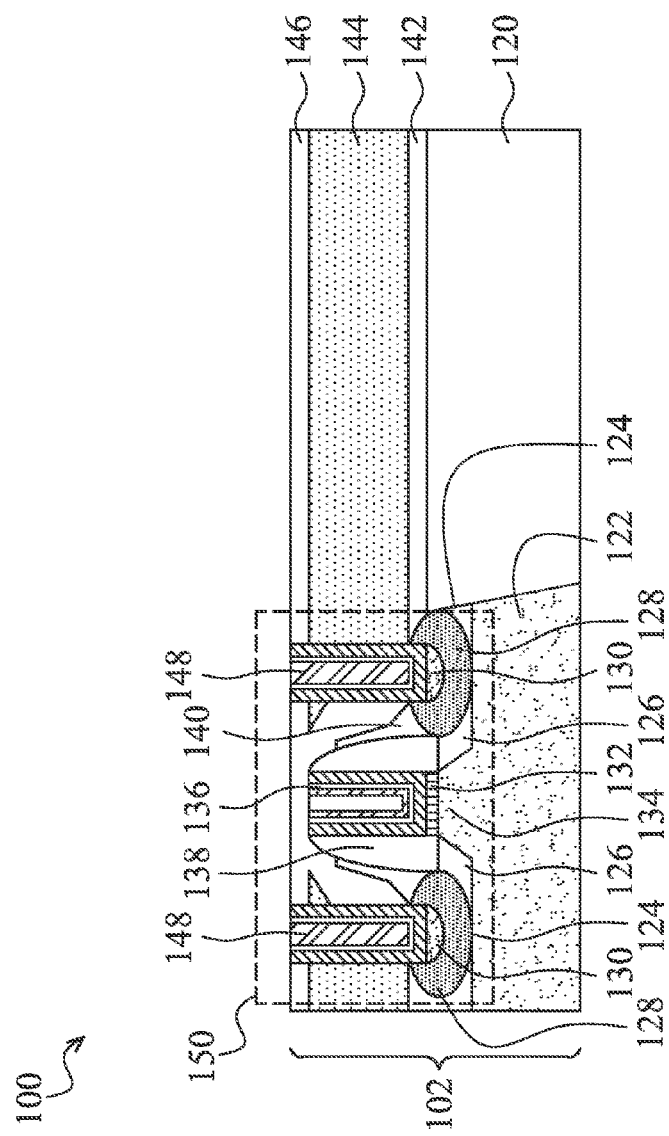
FIGS. 2 through 8 show cross-sectional views of a method of manufacturing a resistor in accordance with an embodiment at various stages using a middle-of-line (MEOL) process.

FIGS. 2 through 8 are cross-sectional views illustrating a method of manufacturing a resistor 112 in accordance with an embodiment at various stages using a middle-of-line (MEOL) process. To manufacture the semiconductor device 100, first, a workpiece 102 is provided that includes a transistor 150 formed on a substrate 120. Only one transistor 150 is shown in FIG. 2; however, a plurality of transistors 150 may be formed across a surface of the workpiece 102, depending on the application of the semiconductor device 100. The transistor 150 shown in FIG. 2 is an example; alternatively, other types and structures of transistors 150 may be included in the workpiece 102 in accordance with various embodiments of the present disclosure.

The workpiece 102 includes a substrate 120 comprising a semiconductive material and a transistor 150 including portions that are formed within and over the substrate 120. A well region 122 for the transistor 150 is formed in the substrate 120 using an implantation process. Source and drain regions 124 of the transistor 150 include implantation regions 126 formed in the substrate 120 and epitaxially grown regions 128 comprised of a material such as SiP formed over the implantation regions 126. A silicide region 130 is formed on a top surface of the source and drain regions 124. The transistor 150 includes a gate dielectric 132 disposed over the well region 122 and a gate 136 disposed over the gate dielectric 132. A channel region 134 of the transistor 150 is disposed in the well region 122 in the substrate 120 beneath the gate dielectric 132. The gate 136 includes a plurality of conductive and/or semiconductive material layers. Sidewall spacers 138 and 140 comprising an insulating material are disposed over the sidewalls of the gate 136 and gate dielectric 134, as shown. A contact etch stop layer (CESL) 142 is formed over the substrate 120 and the sidewall spacers 138 and 140. An insulating material 144 comprising an interlayer dielectric is formed over the CESL 142, and another CESL 146 is disposed over the insulating material 144. The CESL 146 may comprise plasma enhanced oxide (PEOX), SiN, SiC, other materials, or multiple layers and combinations thereof, in some embodiments.

First portions of contacts 148 are formed over the source and drain regions 124 in the CESL 142, insulating material 144, and the CESL 146, as shown. The first portions of contacts 148 may include two or more conductive material layers, such as a first adhesion layer of Ti/TiN and a fill material comprised of tungsten (W). The first portions of contacts 148 may be formed using a damascene process, e.g., by patterning the CESL 142, insulating material 144, and CESL 146 using lithography, and filling the patterns in the CESL 142, insulating material 144, and CESL 146 with the conductive material layers. The excess conductive material layers are removed from over the top surface of the CESL 146 using a chemical mechanical polishing (CMP) process and/or etch process that is adapted to stop on the CESL 146.

Figure 3:
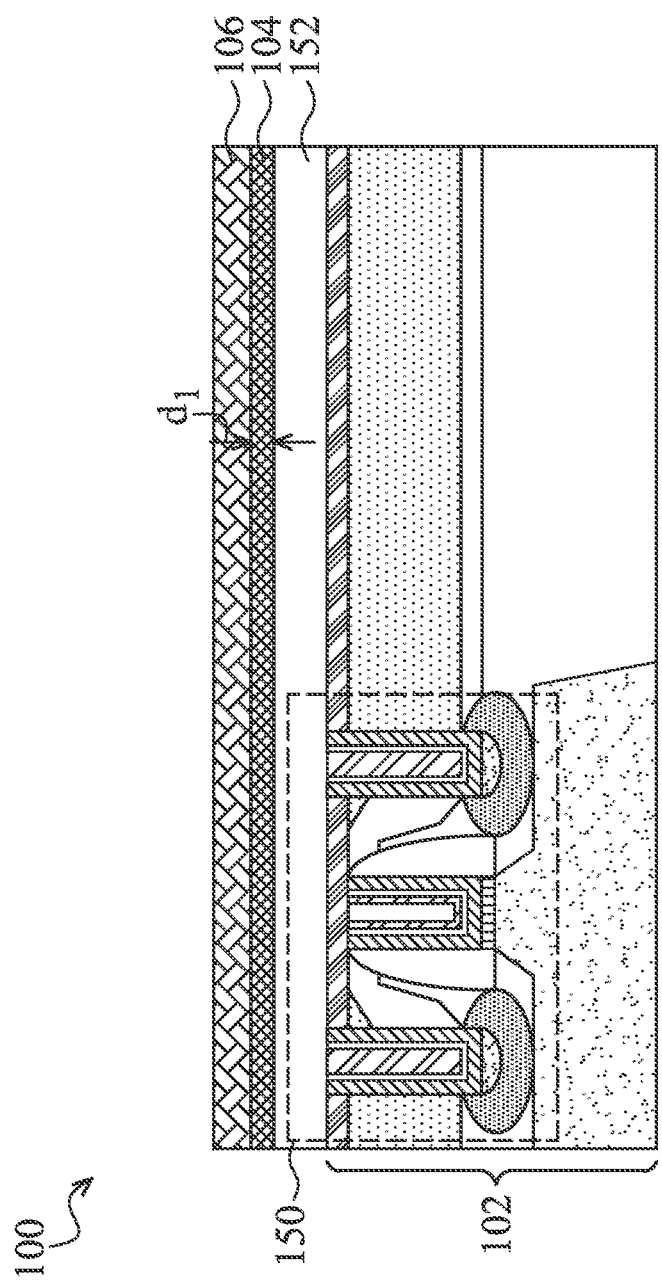

The transistor 150 shown in FIG. 2 is manufactured using a FEOL process. In accordance with an embodiment of the present disclosure, a novel high-precision, high-resistance resistor 112 is formed proximate the transistor 150 after the FEOL process in a MEOL process, before a BEOL process. To manufacture the resistor 112, an insulating material 152 may be formed over the workpiece 102, as shown in FIG. 3. The insulating material 152 comprises about 100 Angstroms of plasma enhanced oxide (PEOX) in some embodiments, although alternatively, the insulating material 152 may comprise other dimensions and materials. The insulating material 152 comprises PEOX, SiN, SiC, other materials, or combinations or multiple layers thereof in some embodiments, for example.

A conductive chemical compound material 104 is formed over the insulating material 152. The conductive chemical compound material 104 comprises a metal comprising a sheet resistance comparable to a sheet resistance of a polysilicon resistor, in an embodiment. The conductive chemical compound material 104 comprises TiN, TaN, WN, other materials, or multiple layers or combinations thereof, for example. The conductive chemical compound material 104 comprises a thickness comprising dimension $d_1$ of about 100 Angstroms or less. In some embodiments, the conductive chemical compound material 104 comprises a thickness of about 50 to 70 Angstroms, as an example. The conductive chemical compound material 104 may be formed using physical vapor deposition, chemical vapor deposition, or sputtering, as examples. The conductive chemical compound material 104 may be formed using a thin film deposition method, for example. Alternatively, the conductive chemical compound material 104 may comprise other materials and dimensions and may be formed using other methods.

An insulating material 106 may be formed over the conductive chemical compound material 104, also shown in FIG. 3. In some embodiments, the insulating material 106 comprises a hard mask. The hard mask 106 may comprise about 60 Angstroms of SiN, as an example. Alternatively, the hard mask 106 may comprise other materials and dimensions.

Figure 4:
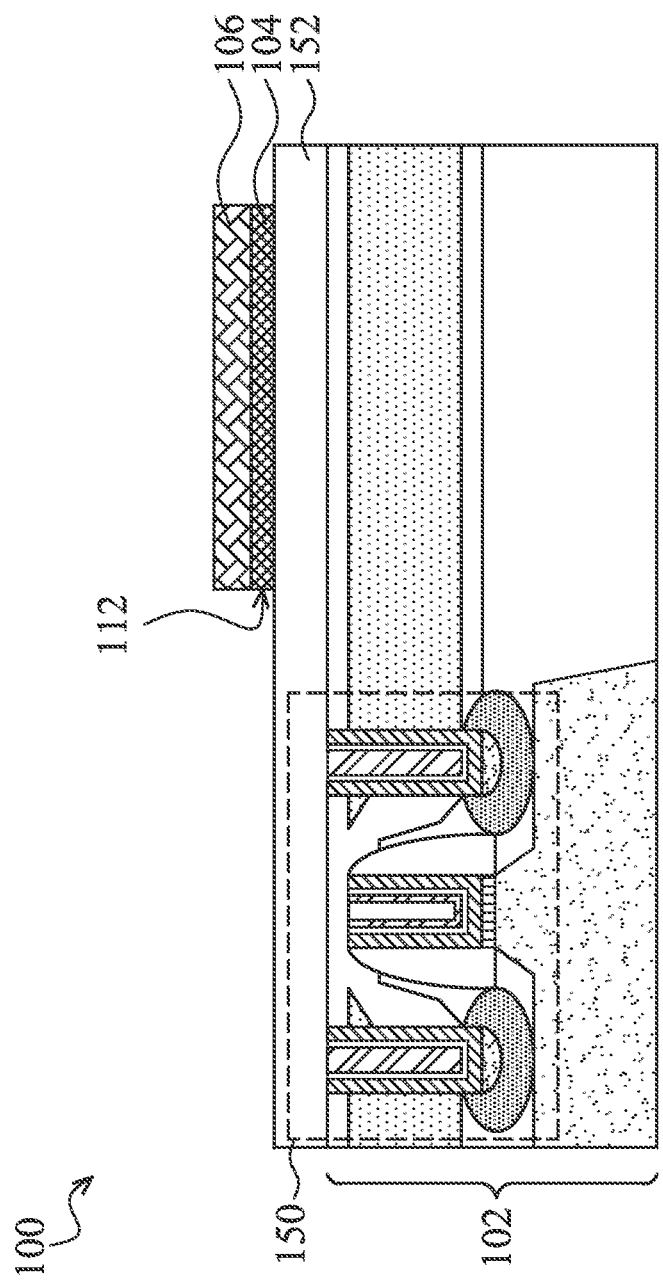

The conductive chemical compound material 104 is patterned using lithography, e.g., by depositing a layer of photoresist (not shown in the drawings) over the insulating material 106, and patterning the insulating material 106 using lithography. The insulating material 106 is then used as a hard mask to pattern the conductive chemical compound material 104, forming a resistor 112, as shown in FIG. 4. Patterning the conductive chemical compound material 104 may comprise an etch process that is adapted to stop on the material of the insulating material 152, for example. The shape of the resistor 112 in a top view of the workpiece 102 may comprise a rectangle, square, or other shapes. The size and shape of the resistor 112 varies depending on the desired resistance of the resistor 112, for example.

Figure 5:
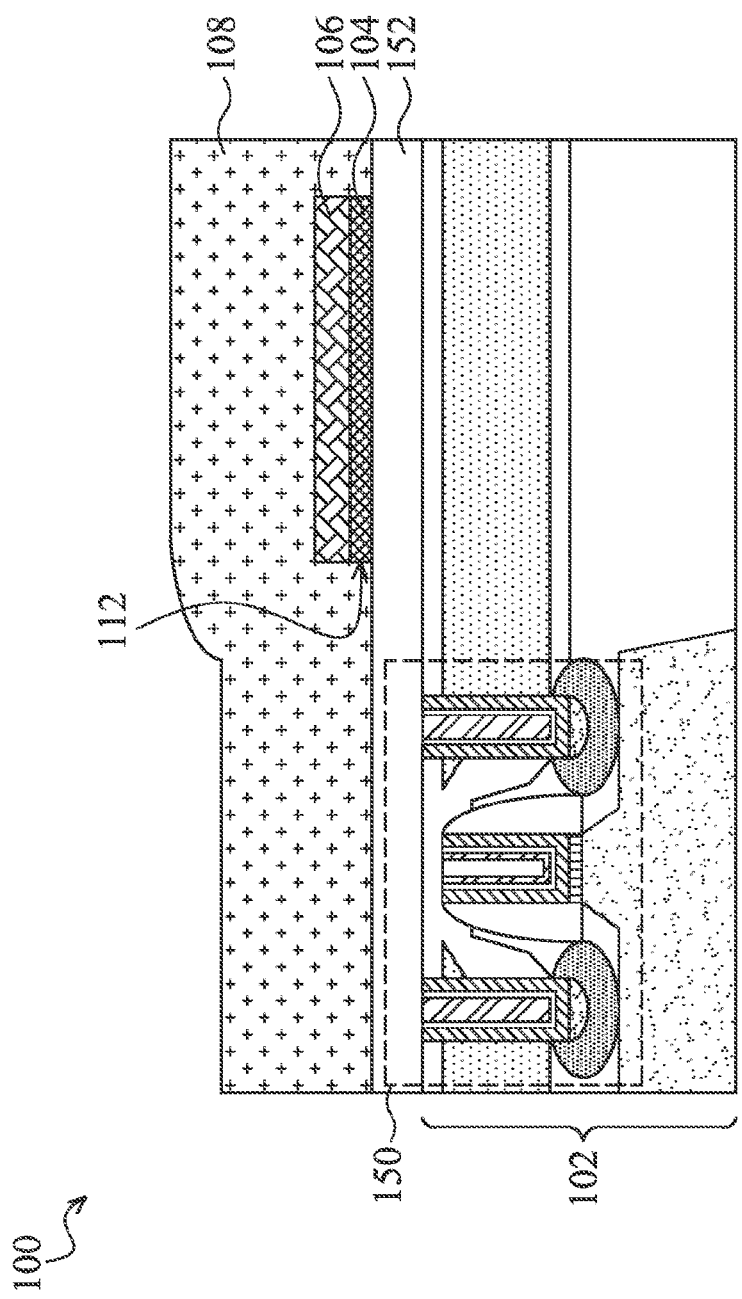

An insulating material 108 is then formed over the resistor 112, e.g., over the insulating material 152 disposed over the transistor 150 and over the insulating material 106 disposed over the resistor 112, as shown in FIG. 5. The insulating material 108 comprises about 900 Angstroms of PEOX in some embodiments, for example. The insulating material 108 may comprise an inter-level dielectric. Alternatively, the insulating material 108 may comprise other dimensions and materials.

Figure 6:
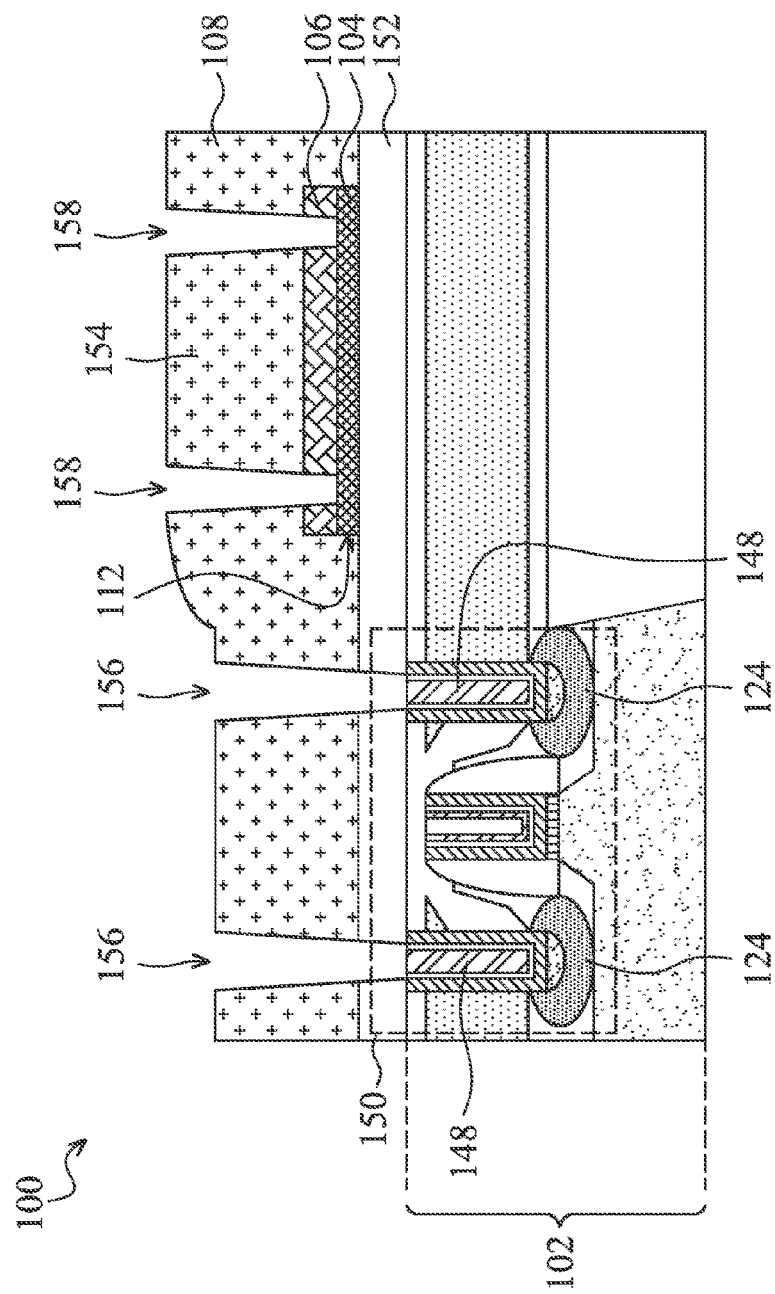
Figure 7:
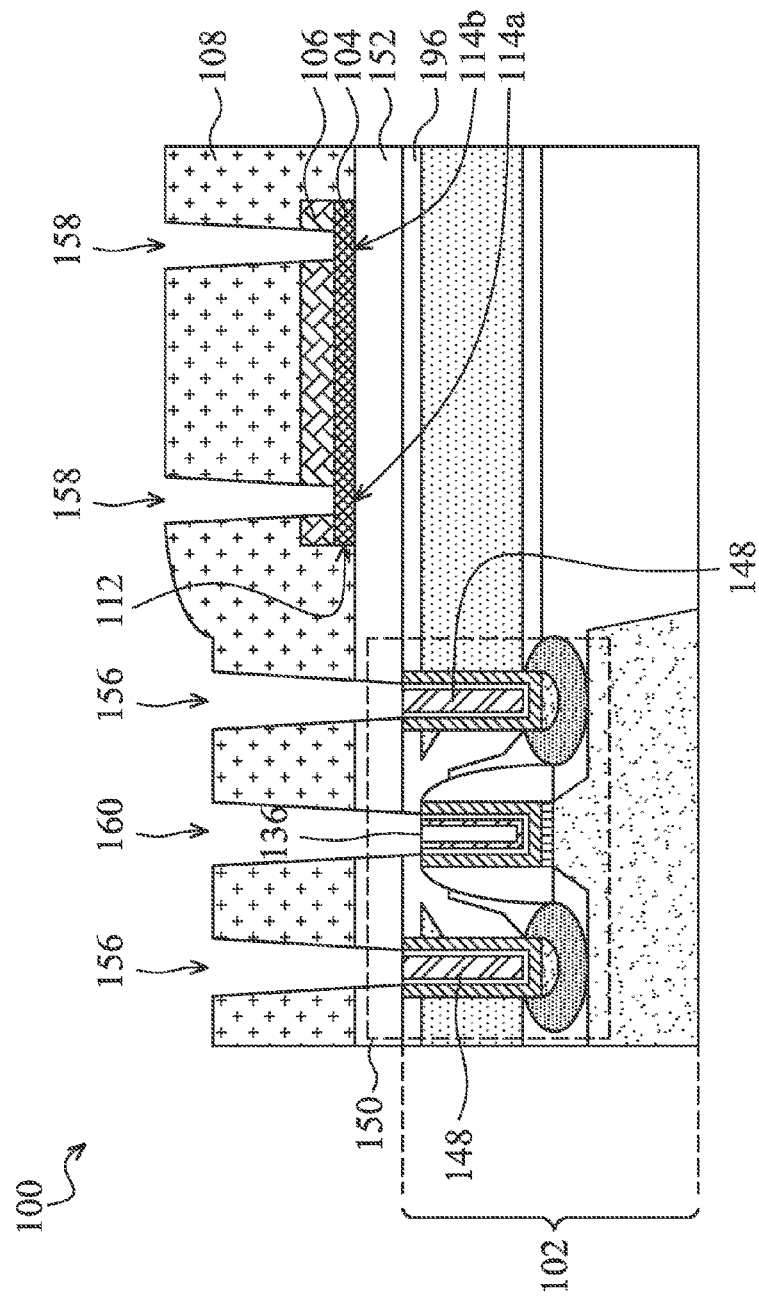
Figure 8:
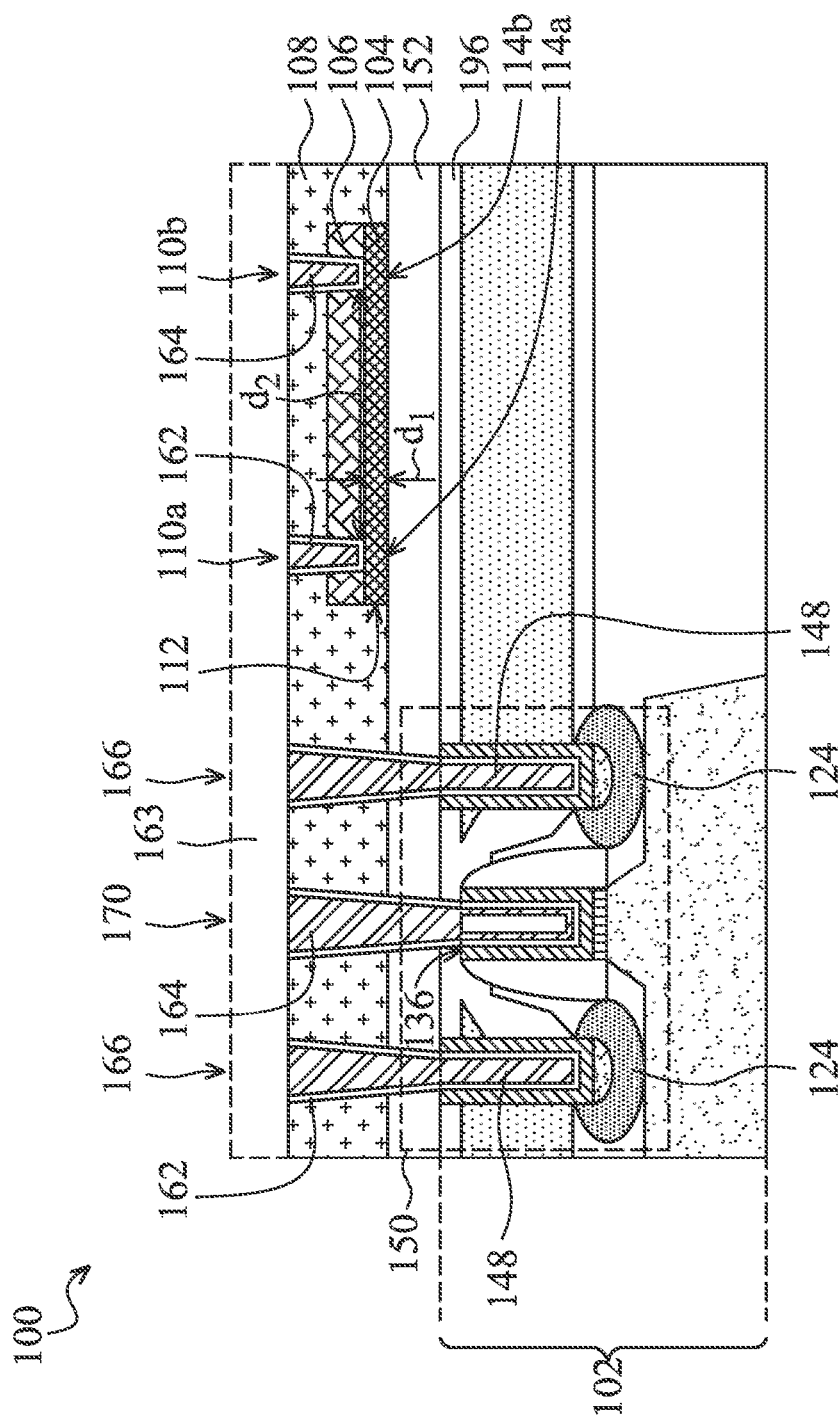

Next, second portions of contacts 166 for source and drain regions 124 of the transistor 150 and contacts 170 for the gate 136 of the transistor 150 are formed in insulating materials 108 and 152 and contacts 110a and 110b for the resistor 112 are formed in insulating materials 106, 108, and 152 using a damascene process, as shown in FIGS. 6, 7, and 8 at various stages of manufacturing. First, patterns 156 are formed in insulating materials 152 and 108 over the transistor 150 and patterns 158 are formed in insulating materials 106, 108, and 152 over the resistor 112 using a lithography process, as shown in FIG. 6. Patterns 156 comprise openings formed in insulating materials 108 and 152 over the first portions of contacts 148 that are coupled to the source and drain regions 124. Patterns 158 comprise openings formed in insulating materials 106, 108, and 152 over the ends 114a and 114b of the resistor 112.

Because the gate 136 materials are different than the first portion of contact 148 materials and the resistor 112 material, a pattern 160 for a gate 136 contact is patterned using an additional lithography process, as shown in FIG. 7. The pattern 160 comprises an opening formed in the insulating material 108 and the CESL 146 over the gate 136 of the transistor 150. A different etch chemistry may be used for the various material layers of the gate 136, for example, in some embodiments. In other embodiments, the pattern 160 for the gate 136 contact may be formed using the same lithography mask and lithography process used to form patterns 156 and 158.

Referring next to FIG. 8, a conductive material 163, shown in dashed lines, is formed over the insulating material 108, covering the top surface of the insulating material 108 and filling the patterns 156, 158, and 160 in the insulating material 108. The conductive material 163 includes a liner 162 comprising an adhesion layer that may comprise a bilayer of Ti/TiN that lines the sidewalls of the patterned insulating materials 106, 108, and 152 and covers the exposed top surfaces of the first portion of contacts 148, the gate 136, and the ends 114a and 114b of the resistor 112. The liner 162 may comprise Ti, TiN, Ta, TaN, other materials, or combinations or multiple layers thereof, for example. The conductive material 163 also includes a fill material 164 comprising tungsten (W) that is formed over the liner 162. Alternatively, the conductive material 163 may comprise other materials. The excess portions of the conductive material 163 residing on the top surface of the insulating material 108 are removed using a chemical mechanical polish (CMP) process and/or an etch process. The top surface of the insulating material 108 is also planarized in some embodiments during the CMP and/or etch process, removing the uneven topography of the insulating material 108.

The resistor 112 comprises a thickness comprising dimension $d_1$ and a length comprising dimension $d_2$ between the contacts 110a and 110b. Dimensions $d_1$ and $d_2$ are selected in accordance with a resistance value of the designed resistor 112. Dimension $d_2$ may comprise about several μm to several mm, as examples. Alternatively, dimension $d_2$ may comprise other values.

The process shown in FIGS. 2 through 8 comprises a MEOL process that is used to form second portions of contacts 166 over first portions of contacts 148 for the source and drain regions 124 of the transistor 150. The second portions of contacts 166 comprise the liner 162 and the fill material 164, for example. A BEOL process may then be performed to form third portions of contacts coupled to the second portions of contacts 166 and to form second portions of contacts coupled to the first portions of contacts 170 to the gate 136. The top conductive material layers that are later formed over the semiconductor device 100 shown in FIG. 8 may comprise copper or copper alloys, for example. Upper portions of contacts may also be coupled to the contacts 110a and 110b of the resistor 112, to provide electrical connection to the resistor 112 in upper metallization layers that are later formed.

Advantageously, the resistor 112 is formed using an additional material layer 104 and only one additional lithography mask and process that are used to pattern the resistor 112. Contacts 110a and 110b for the resistor 112 are formed using the same lithography mask and process that is used to pattern second portions of contacts 166 for the source and drain regions 124, advantageously.

Note that insulating material layers 152 and 106 are not included in some embodiments; alternatively, the conductive chemical compound material 104 may be formed directly over the CESL 146 which is insulative, and insulating material 108 may be formed directly over the resistor 112.

Figure 9:
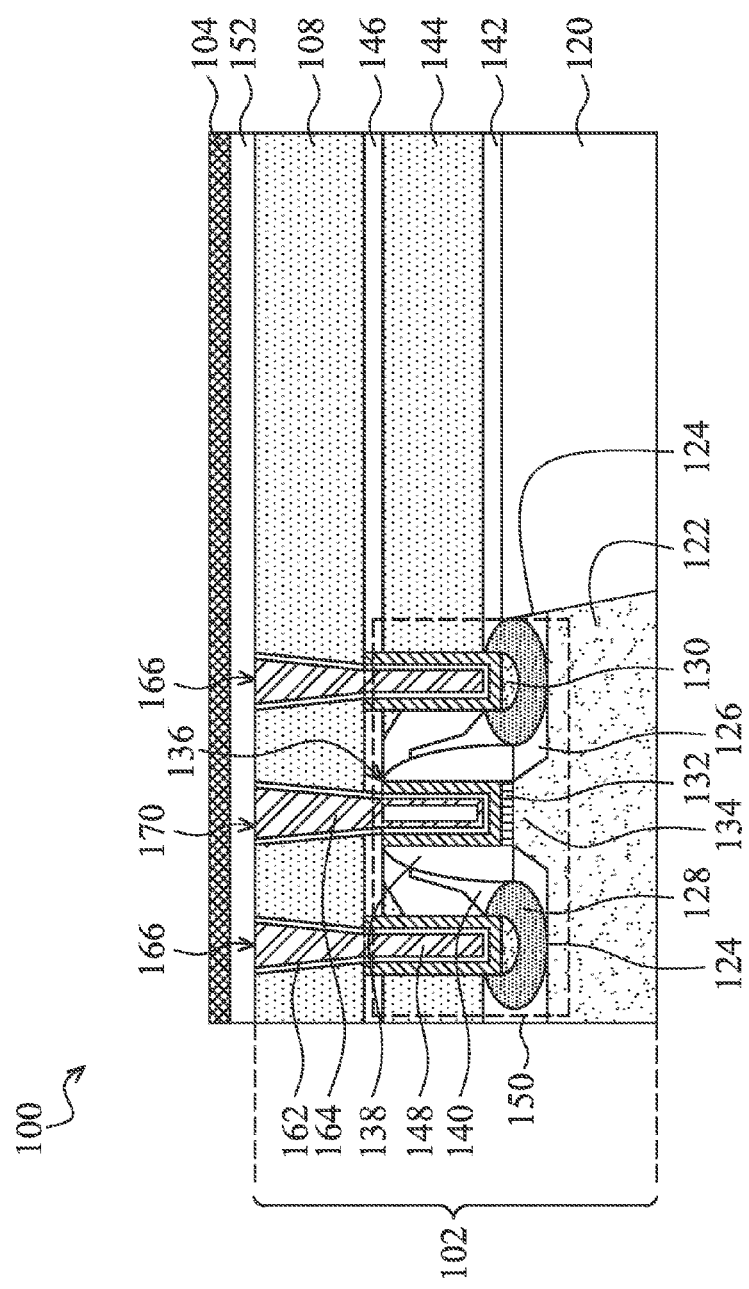
FIGS. 9 through 14 show cross-sectional views of a method of manufacturing a resistor in accordance with another embodiment at various stages using a back-end-of-line (BEOL) process.

FIGS. 9 through 14 are cross-sectional views of a semiconductor device 100 illustrating a method of manufacturing a resistor 112 in accordance with another embodiment at various stages using a back-end-of-line (BEOL) process. In FIG. 9, a semiconductor device 100 is provided wherein a workpiece 102 includes second portions of contacts 166 comprising a liner 162 and fill material 164 formed over first portions of contacts 148 to the source and drain regions 124 of the transistor 150. The workpiece 102 also includes contacts 170 formed over the gate 136 of the transistor 150. The contacts 170 comprise first portions of contacts 170 in this embodiment. The portions of contacts 166 and 170 may be formed using a similar method described for the first embodiment shown in FIGS. 2 through 8, without the inclusion of the resistor 112, for example.

After the FEOL and MEOL processes are performed, the workpiece 102 is provided, as shown in FIG. 9. An insulating material 152 is formed over the workpiece 102. The insulating material 152 comprises about 200 Angstroms of SiC in this embodiment, for example. The insulating material 152 comprises an etch stop layer in some embodiments, for example. Alternatively, the insulating material 152 may comprise other materials and dimensions.

Figure 10:
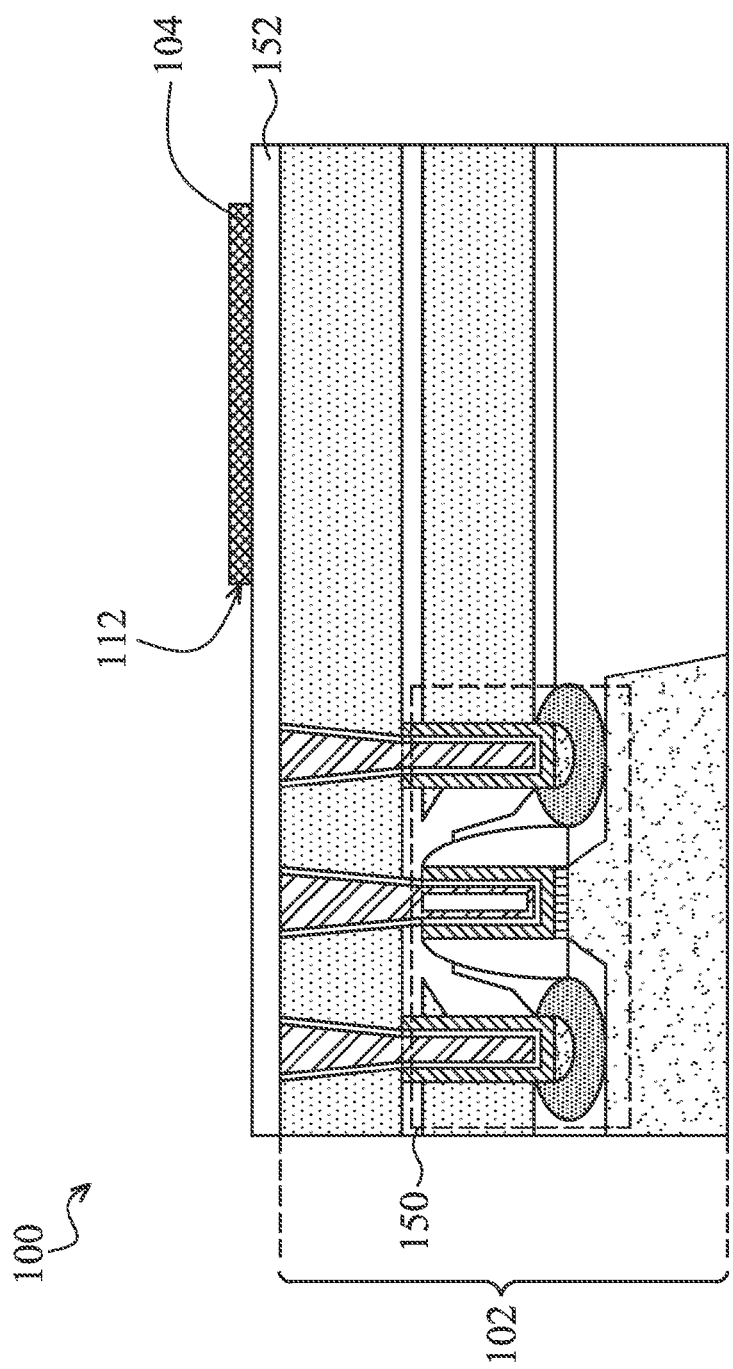
Figure 11:
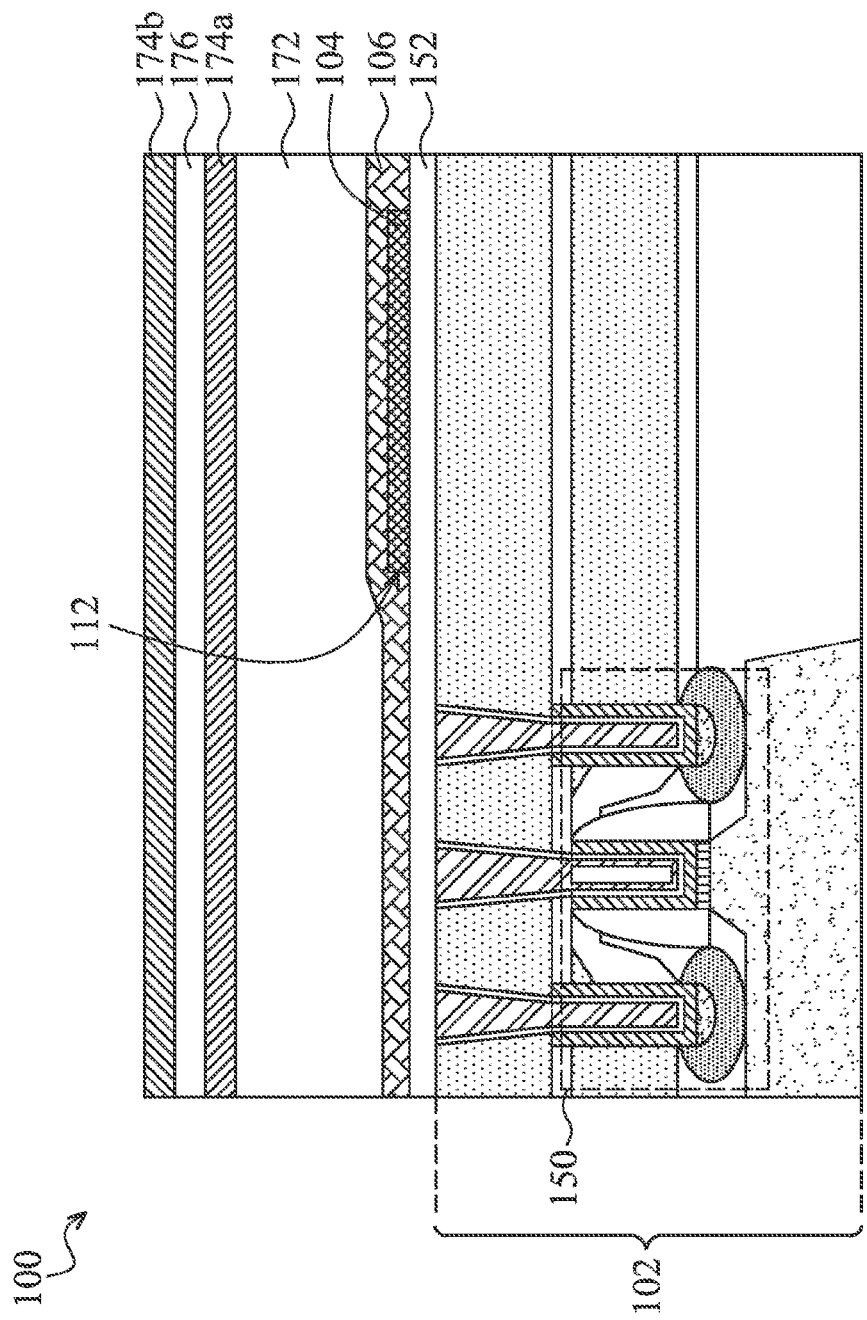

The conductive chemical compound material 104 is formed over the insulating material 152, also shown in FIG. 9. The conductive chemical compound material 104 comprises similar materials and dimensions as described for the previous embodiment, for example. The conductive chemical compound material 104 is patterned using lithography, forming a resistor 112 comprised of the conductive chemical compound material 104, as shown in FIG. 10. A hard mask is not used to pattern the conductive chemical compound material 104 in this embodiment, for example. An insulating material 106 is formed over the resistor 112, as shown in FIG. 11. The insulating material 106 may comprise about 150 Angstroms of tetra ethyl oxysilane (TEOS), for example, although alternatively, insulating material 106 may comprise other dimensions and materials.

A low dielectric constant (k) insulating material 172 is formed over the insulating material 106, also shown in FIG. 11. The low k insulating material 172 may comprise about 1,300 Angstroms of a low-k material having a dielectric constant less than a dielectric constant of silicon dioxide (which typically has a k value of about 3.9), such as such as fluorine-doped silicon dioxide, carbon-doped silicon dioxide, or porous carbon-doped silicon dioxide, as examples. Alternatively, the low k insulating material 172 may comprise other materials and dimensions. The low k insulating material 172 may also comprise $SiO_2$ or other non-low k insulating materials.

A first anti-reflective coating (ARC) 174a is formed over the low k insulating material 172, also shown in FIG. 11. The first ARC 174a comprises a thickness of about 300 Angstroms, for example. A metal layer 176 is formed over the first ARC 174a. The metal layer 176 comprises about 330 Angstroms of TiN. A second ARC 174b is formed over the metal layer 176. The second ARC 174b comprises a thickness of about 300 Angstroms. Alternatively, the first ARC 174a, second ARC 174b, and metal layer 176 may comprise other dimensions and may comprise other materials, for example.

Figure 12:
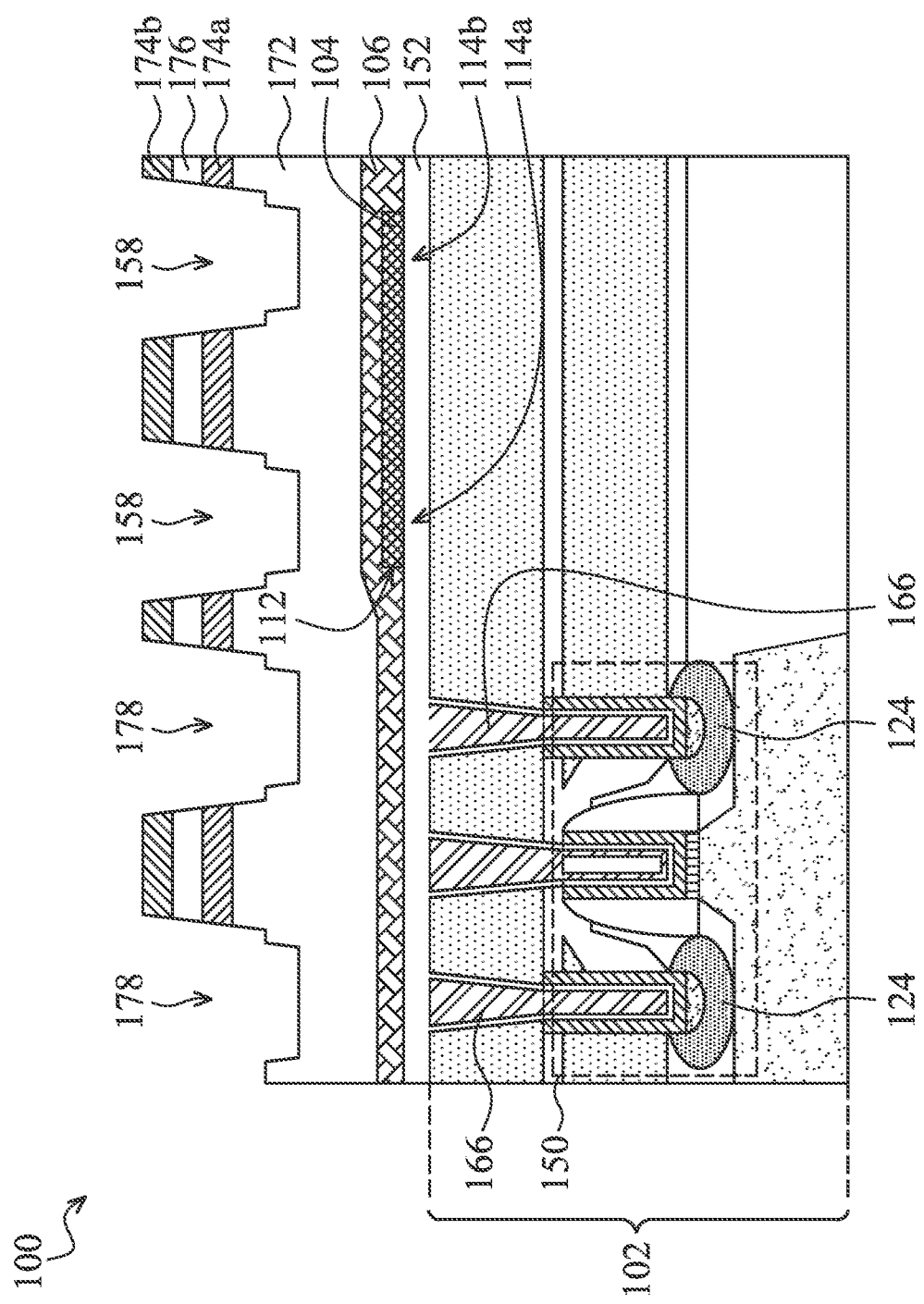

The second ARC 174b, the metal layer 176, and an upper portion of the first ARC 174a are patterned with a conductive line pattern using a first lithography mask and a first lithography process, as shown in FIG. 12. The lower portion of the first ARC 174a and an upper portion of the low k insulating material 172 are patterned with a via pattern using a second lithography mask and a second lithography process, also shown in FIG. 12. Patterns 178 comprise openings in the upper part of the low k insulating material 172, the second ARC 174b, the metal layer 176, and the first ARC 174a over the second portion of contacts 166. Patterns 158 comprise openings in the upper part of the low k insulating material 172, the second ARC 174b, the metal layer 176, and the first ARC 174a over the ends 114a and 114b of the resistor 112.

Figure 13:
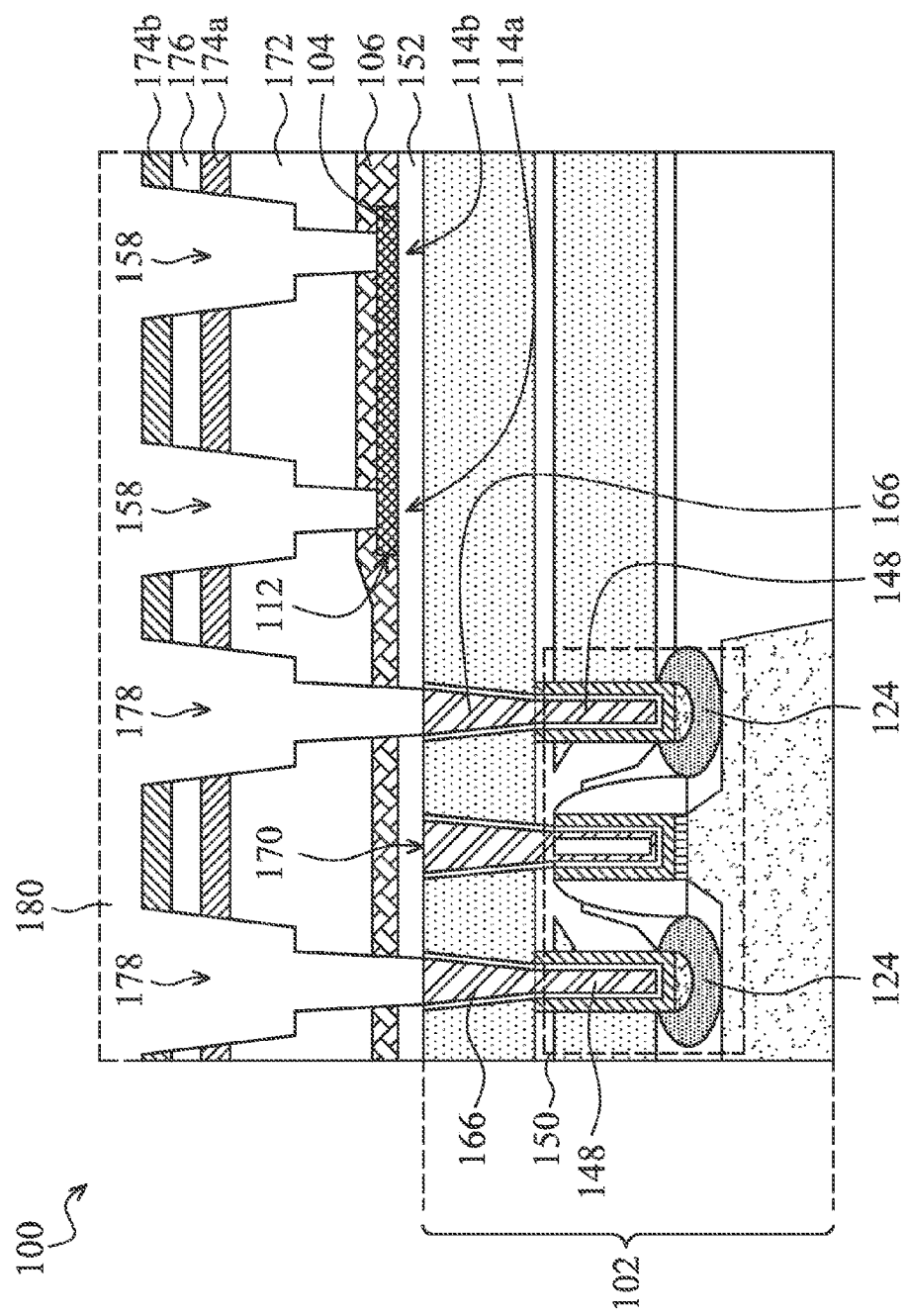

An additional etch process comprising a via etch process is performed on the semiconductor device 100, extending the patterns 178 and 158 completely through the first ARC 174a and lower into the low k insulating material 172 until top surfaces of the second portions of contacts 166 for the source and drain regions 124 and the top surfaces of the ends 114a and 114b of the resistor 112 are exposed, as shown in FIG. 13. The via etch process is adapted to stop when the material of the resistor 112 is reached, e.g., using an endpoint detector, in some embodiments. A conductive material 180, shown by dashed lines in FIG. 13, is formed over the patterned second ARC 174b, metal layer 176, first ARC 174a, and low k insulating material 172, covering the top surface of the second ARC 174b. The conductive material 180 may comprise Cu or Cu alloys and may include one or more liners and/or seed layers, as examples, not shown. The conductive material 180 may comprise W, Cu, Ti, TiN, Ta, TaN, other materials, or combinations or multiple layers thereof in some embodiments, for example. Alternatively, the conductive material 180 may comprise other materials.

Figure 14:
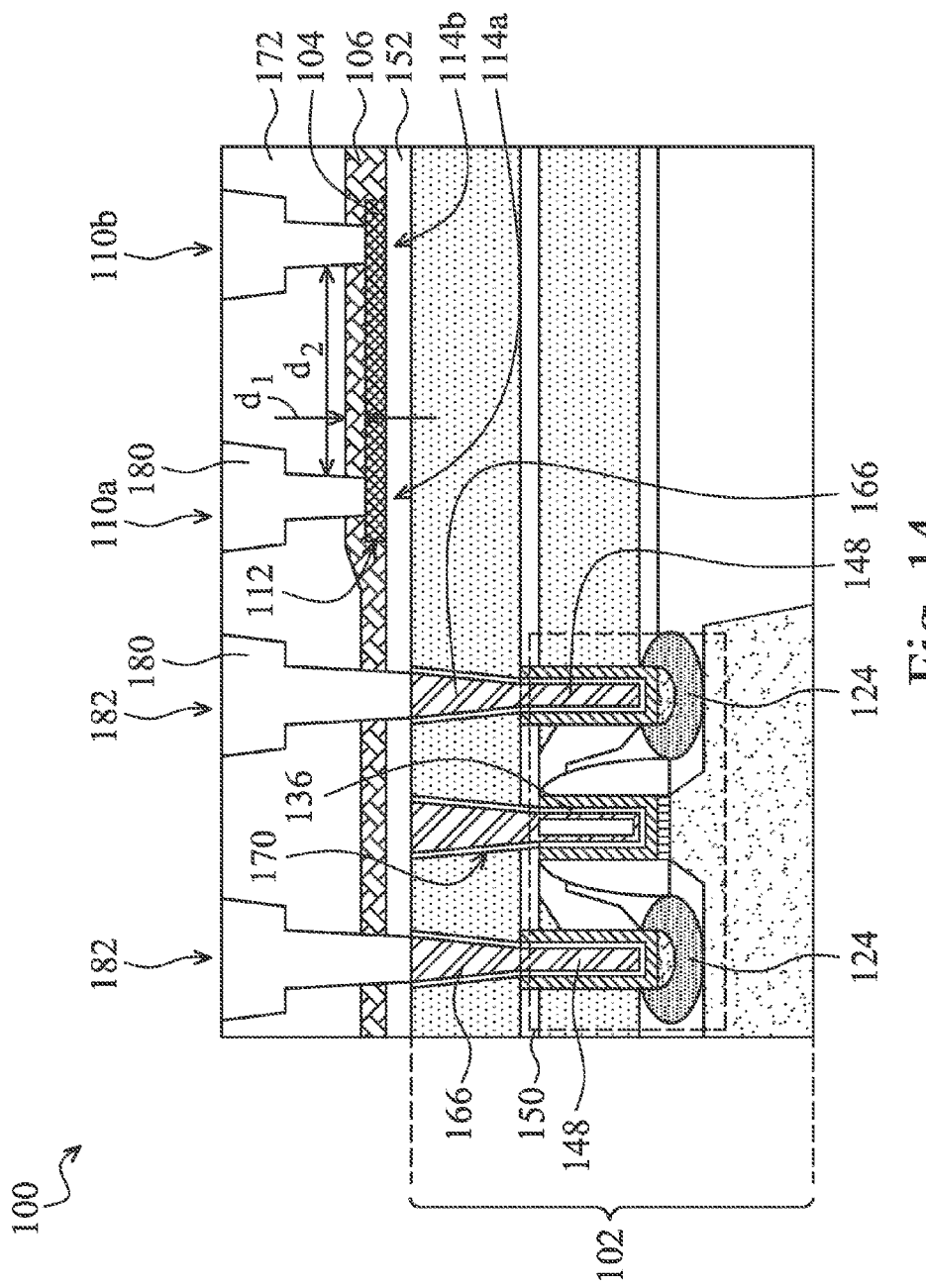

A CMP process and/or etch process is used to remove the conductive material 180, the second ARC 174b, the metal layer 176, and the first ARC 174a from over the top surface of the low k material layer 172, as shown in FIG. 14. Material layer 176 comprising the metal layer is removed to avoid shorting the conductive features formed, such as the third portions of contacts 182 for the source and drain regions 124 and the contacts 110a and 110b for the resistor 114, for example. The conductive material 180 left remaining in the low k insulating material 172 and insulating material 106 comprises third portions of contacts 182 for the source and drain regions 124 and the contacts 110a and 110b coupled to the first end 114a and the second end 114b, respectively, of the resistor 112. Advantageously, the contacts 110a and 110b for the resistor 112 are formed using the same lithography masks used to form the third portions of contacts 182 for the source and drain regions 124 of the transistor 150. The first portions of contacts 148, second portions of contacts 166, and third portions of contacts 182 comprise vertical conductive stacks of conductive plugs within the various insulating materials of the semiconductor device 100 that provide vertical connection of the source and drain regions 124 of the transistor 150 to upper levels of the semiconductor device 100.

The insulating materials 108 or 172 that portions of the contacts 110a and 110b are formed in may comprise a thickness of about 1,500 Angstroms or less in some embodiments, for example. The insulating materials 108 or 172 may alternatively comprise other dimensions.

Figure 15:
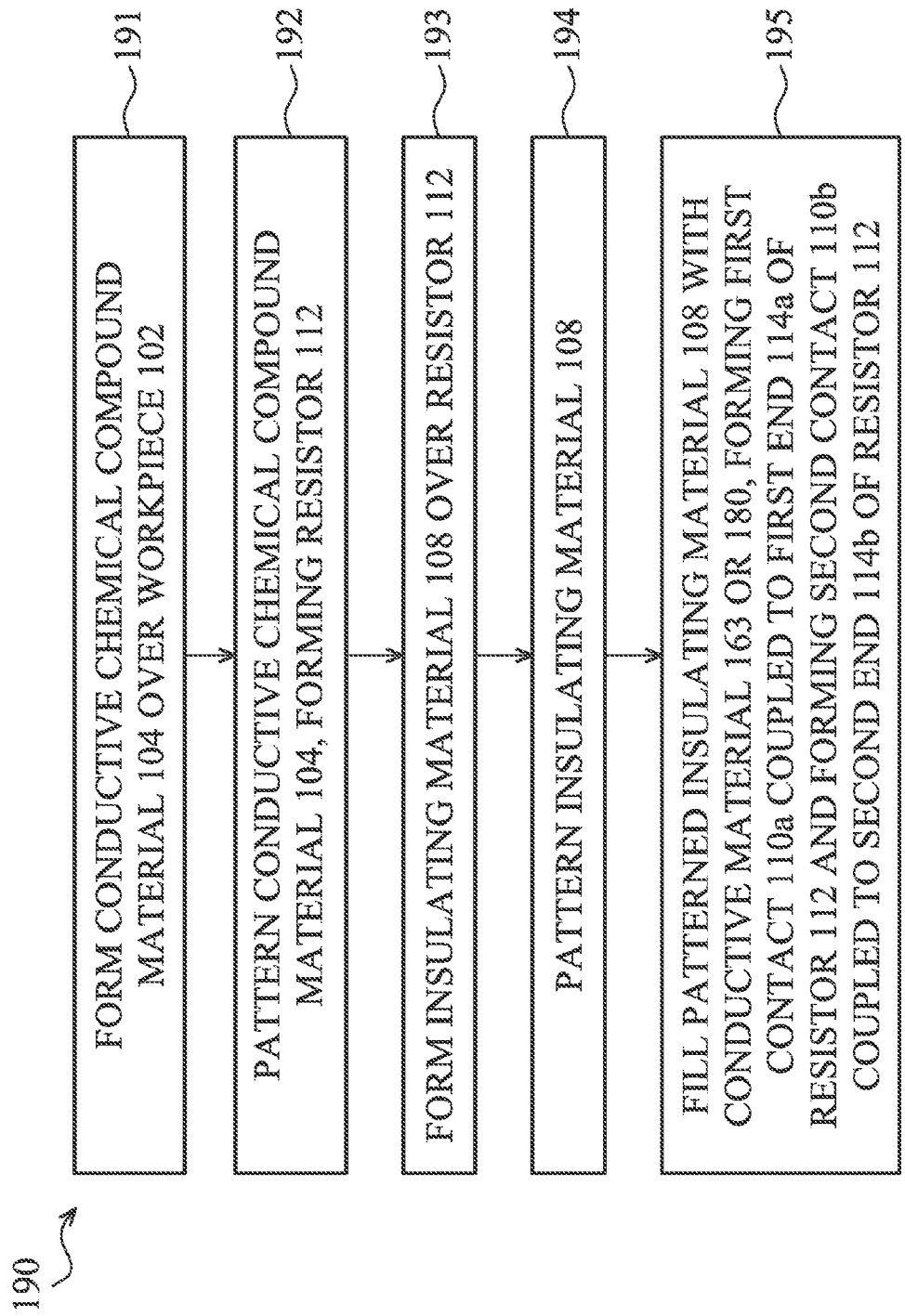
FIG. 15 is a flow chart illustrating a method of forming a resistor in accordance with an embodiment.

FIG. 15 is a flow chart 190 illustrating a method of forming a resistor 112 in accordance with an embodiment. In step 191, a conductive chemical compound material 104 is formed over the workpiece 102. In step 192, the conductive chemical compound material 104 is patterned, forming a resistor 112. In step 193, an insulating material 108 is formed over the resistor 112, and in step 194, the insulating material 108 is patterned. In step 195, the patterned insulating material 108 is filled with conductive material 163 in the embodiment shown in FIG. 2 through 8 or conductive material 180 in the embodiment shown in FIGS. 9 through 14, forming a first contact 110a that is coupled to a first end 114a of the resistor 112 and forming a second contact 110b that is coupled to a second end 114b of the resistor 112.

Embodiments of the present disclosure include methods of forming semiconductor devices 100 and resistors 112, and also include semiconductor devices 100 that include the novel resistors 112 described herein.

Advantages of various embodiments of the disclosure include providing novel resistor 112 manufacturing methods and structures. Upper level MEOL and BEOL processes may be modified slightly to include the novel resistors 112 described herein comprising a resistance comparable to a resistance of a polysilicon resistor, with very little process flow impact. Polysilicon resistors can be replaced in semiconductor device 100 designs that include the resistors 112 described herein, simplifying manufacturing process flows, saving lithography masks and process steps, reducing implantation process steps (e.g., that were previously used to implant polysilicon resistors), and decreasing costs. The resistors 112 provide high precision resistors 112 that are formed after the formation of final (e.g., replacement) gates 136 of transistors 150, for example. Only one additional lithography mask and lithography step is used to manufacture the resistors 112 described herein. The patterns for contacts 110a and 110b can advantageously be included in existing lithography masks and process steps. The resistance of the resistors 112 is highly tunable and the manufacturing process is flexible, resulting in resistors within a wafer 3-sigma variation in some embodiments. The novel semiconductor devices 100 and resistor 112 structures and designs are easily implementable in manufacturing process flows.

In accordance with one embodiment of the present disclosure, a method of manufacturing a semiconductor device includes forming a first insulating material over a workpiece, and forming a conductive chemical compound material over the first insulating material. The conductive chemical compound material is patterned to form a resistor. A second insulating material is formed over the resistor, and the second insulating material is patterned. The patterned second insulating material is filled with a conductive material to form a first contact coupled to a first end of the resistor and to form a second contact coupled to a second end of the resistor. The second end of the resistor is different from the first end of the resistor.

In accordance with another embodiment, a method of forming a resistor of a semiconductor device includes providing a workpiece, forming a device over the workpiece, and forming a first insulating material over the workpiece. The method includes forming a conductive chemical compound material over the first insulating material, and patterning the conductive chemical compound material to form a resistor proximate the device. A second insulating material is formed over the resistor, and the second insulating material is patterned with patterns for a first contact and a second contact for the resistor. The method includes filling the patterned second insulating material with a conductive material, forming the first contact coupled to a first end of the resistor, and forming the second contact coupled to a second end of the resistor, the second end being different from the first end.

In accordance with yet another embodiment, a semiconductor device includes a workpiece, a transistor disposed over the workpiece, and a first insulating material disposed over the transistor and the workpiece. A resistor comprising a conductive chemical compound material is disposed over the first insulating material proximate the transistor. A second insulating material is disposed over the resistor and the transistor. A plurality of contacts is disposed in the second insulating material, the plurality of contacts including a first contact coupled to a first end of the resistor, a second contact coupled to a second end of the resistor, a source contact coupled to a source region of the transistor, and a drain contact coupled to a drain region of the transistor. The source contact and the drain contact are further disposed in the first insulating material. The second end of the resistor is different from the first end of the resistor.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device, comprising:
a transistor disposed on a substrate;
a first insulating material disposed over the transistor and the substrate, the first insulating material directly adjoining the gate structure of the transistor;
a second insulating material disposed directly on the first insulating material, the second insulating material being a continuous material composition from a bottom surface of the second insulating material to a top surface of the second insulating material;
a resistor disposed directly on the top surface of the second insulating material proximate the transistor;
a third insulating material over the resistor; and
a plurality of contacts disposed in the third insulating material, the plurality of contacts including a first contact coupled to a first end of the resistor, a second contact coupled to a second end of the resistor, the second end of the resistor being different from the first end of the resistor, a source contact coupled to a source region of the transistor, and a drain contact coupled to a drain region of the transistor, the source contact and the drain contact further being disposed in the first and second insulating materials.

2. The semiconductor device of claim 1, wherein the resistor comprises a conductive chemical compound material.

3. The semiconductor device according to claim 2, wherein the conductive chemical compound material of the resistor comprises a material selected from a group consisting of TiN, TaN, WN, and combinations thereof.

4. The semiconductor device according to claim 2, wherein the conductive chemical compound material of the resistor comprises a metal.

5. The semiconductor device according to claim 1, wherein the resistor comprises a thickness of about 100 Angstroms or less.

6. The semiconductor device according to claim 1, wherein the third insulating material comprises a material selected from a group consisting of a plasma enhanced oxide (PEOX), a low dielectric constant (k) insulating material having a dielectric constant less than a dielectric constant of silicon dioxide, an anti-reflective coating (ARC), and combinations thereof.

7. The semiconductor device according to claim 1, wherein the resistor comprises a sheet resistance of about 200 to 1,000 Ohms per square ($\Omega$/sq).

8. The semiconductor device of claim 1, wherein the second insulating material comprises an etch stop layer.

9. The semiconductor device of claim 8, wherein the etch stop layer comprises a material selected from a group consisting of plasma enhanced oxide (PEOX), SiN, SiC, and combinations thereof.

10. A semiconductor device comprising:
a device disposed on a substrate;
a device contact coupled to the device, wherein the device contact comprises a conductive material;
a first insulating material over the substrate, the first insulating material being a single layer of insulating material;
a resistor disposed over the first insulating material proximate the device;
a second insulating material over the resistor;
a first contact and a second contact in the second insulating material, the first contact coupled to a first end of the resistor and the second contact coupled to a second end of the resistor, the second end of the resistor being different from the first end of the resistor; and
a third contact comprising the conductive material in the first insulating material and the second insulating material coupled to the device contact, the conductive material being continuous from the device contact through the third contact, top surfaces of the first contact, the second contact, the third contact, and the second insulating material being substantially coplanar.

11. The semiconductor device of claim 10, wherein the resistor comprises a conductive chemical compound material.

12. The semiconductor device according to claim 11, wherein the conductive chemical compound material of the resistor comprises a material selected from a group consisting of TiN, TaN, WN, and combinations thereof.

13. The semiconductor device according to claim 11, wherein the conductive chemical compound material of the resistor comprises a metal.

14. The semiconductor device according to claim 10, wherein the resistor comprises a thickness of about 100 Angstroms or less.

15. The semiconductor device according to claim 10, wherein the second insulating material comprises a material selected from a group consisting of a plasma enhanced oxide (PEOX), a low dielectric constant (k) insulating material having a dielectric constant less than a dielectric constant of silicon dioxide, an anti-reflective coating (ARC), and combinations thereof.

16. The semiconductor device according to claim 10, wherein the resistor comprises a sheet resistance of about 200 to 1,000 Ohms per square ($\Omega$/sq).

17. A semiconductor device comprising:
an active device within a semiconductor substrate;
a first dielectric layer over the active device and the semiconductor substrate;
a first device contact extending through the first dielectric layer to a first plane, the first plane being substantially coplanar with a top surface of the semiconductor substrate, the first device contact having a top surface substantially coplanar with a top surface of the first dielectric layer;
a second dielectric layer over the first dielectric layer;
a resistor over the second dielectric layer;
a third dielectric layer over the resistor and the active device;
at least one conductive contact extending through the second and third dielectric layers to the first device contact, wherein a top surface of the at least one conductive contact is substantially coplanar with a top surface of the third dielectric layer, and wherein at least a portion of the top surface of the at least one conductive contact overlies at least a portion of a bottom surface of the first device contact in the first plane; and a first conductive contact and a second conductive contact extending through the third dielectric layer to the resistor, the first conductive contact coupled to a first end of the resistor and the second conductive contact being coupled to a second end of the resistor.

18. The semiconductor device of claim 17, wherein the resistor comprises a metal-containing layer.

19. The semiconductor device of claim 17, wherein the resistor comprises a conductive chemical compound material selected from the group consisting of TiN, TaN, WN, and combinations thereof.

20. The semiconductor device of claim 17, wherein top surfaces of the at least one conductive contact, the first conductive contact, the second conductive contact, and the third dielectric layer are substantially coplanar.

\* \* \* \* \*